(12) United States Patent
Komoto (10) Patent No.: US 8,253,428 B2
(45) Date of Patent: Aug. 28, 2012

(54) PROBE APPARATUS AND TEST APPARATUS

(75) Inventor: Yoshio Komoto, Gunma (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/885,403

(22) Filed: Sep. 17, 2010

(65) Prior Publication Data

US 2011/0074456 A1    Mar. 31, 2011

Related U.S. Application Data

(63) Continuation of application No. PCT/JP2009/004852, filed on Sep. 25, 2009.

(51) Int. Cl.
*G01R 31/20* (2006.01)

(52) U.S. Cl. .......... 324/754.03; 324/756.03; 324/762.01

(58) Field of Classification Search .......... 324/754.01–754.31, 755.01–755.11, 324/756.01–756.07, 762.01–762.05, 750.22, 324/750.17
See application file for complete search history.

(56) References Cited

U.S. PATENT DOCUMENTS

| | | | |
|---|---|---|---|
| 5,012,187 A | | 4/1991 | Littlebury |
| 6,215,321 B1 * | | 4/2001 | Nakata .................... 324/756.03 |
| 6,825,052 B2 * | | 11/2004 | Eldridge et al. ................ 438/15 |
| 2005/0174131 A1 | | 8/2005 | Miller |
| 2006/0290367 A1 * | | 12/2006 | Hobbs et al. .................. 324/763 |
| 2008/0106257 A1 * | | 5/2008 | Suzuki ........................ 324/202 |
| 2009/0079449 A1 * | | 3/2009 | Marbler ....................... 324/754 |
| 2009/0102494 A1 | | 4/2009 | Miller |
| 2011/0074455 A1 * | | 3/2011 | Nakata et al. ............ 324/754.03 |

FOREIGN PATENT DOCUMENTS

| | | |
|---|---|---|
| JP | 2001-289898 A | 10/2001 |
| JP | 2007-520722 A | 7/2007 |
| JP | 2009-85720 A | 4/2009 |
| WO | 2005/076885 A2 | 8/2005 |

OTHER PUBLICATIONS

International Search Report (ISR) issued in PCT/JP2009/004852 (parent application) mailed in Dec. 2009 for Examiner consideration.
Korean Office Action dated Oct. 7, 2011, in a counterpart Korean patent application No. 10-2010-7018540, citing US2006/0290367.
Written Opinion (PCT/ISA/237) issued in PCT/JP20091004852 mailed in Dec. 2009.

* cited by examiner

*Primary Examiner* — Arleen M Vazquez
(74) *Attorney, Agent, or Firm* — Chen Yoshimura LLP (57) ABSTRACT

A probe apparatus exchanging signals with a target device, includes: a contact section electrically connected to the target device by contacting a terminal of the target device; a non-contact section that exchanges signals with the target device in a state not contacting the terminal of the target device; and a retaining section that retains the contact section and the non-contact section, in such a manner that a relative position between the contact section and the non-contact section in a connection direction connecting the non-contact section and a region corresponding to the target device is displaceable.

20 Claims, 9 Drawing Sheets

PROBE APPARATUS AND TEST APPARATUS

BACKGROUND

1. Technical Field

The present invention relates to a probe apparatus and a test apparatus. Note that the present application is a patent application regarding the result of government-sponsored research (New Energy and Industrial Technology Development Organization, year of 2007, "Leading Research on Next Generation Three Dimensional Lamination Technology," Sponsored Research, Art. 19 of Patent Application Under Industrial Technology Enhancement Act).

2. Related Art

An apparatus for exchanging signals with a semiconductor wafer by non-contact coupling by means of magnetic field coupling and electric field coupling has been a conventionally known probe card used for examining a semiconductor wafer (see Patent Document No. 1, for example). A probe card in which non-contact coupling and contact coupling are mixed is also known to examine a semiconductor wafer in which contact terminals and non-contact terminals are mixed (see Patent Document 2, for example).

Patent Document No. 1: Japanese Patent Application Publication No. 2009-85720
Patent Document No. 2: Japanese Patent Application Publication No. 2007-520722

The coupling strength of non-contact coupling depends on the distance between the terminal of the semiconductor wafer and the terminal of the probe card. Therefore, in non-contact coupling, it is desirable that the terminal of the semiconductor wafer is provided in the closest proximity to the terminal of the probe card as much as possible.

However, when a non-contact coupling terminal and a contact coupling terminal are mixed on a substrate of a probe card, it is difficult to form the non-contact coupling terminal such as a coil to have the same level of height as the contact coupling terminal such as a bump or a probe pin. Generally speaking, contact coupling terminals are longer than non-contact coupling terminals.

The distance between a probe care and a semiconductor wafer in connected state is determined by the length of the contact coupling terminal. Since contact coupling terminals are longer than non-contact coupling terminals as mentioned above, there will be a gap created between a non-contact coupling terminal and a semiconductor wafer, corresponding to the length of the contact coupling terminal.

Moreover, the non-contact coupling terminal is fixed to the substrate of the probe card. Therefore, it is impossible to adjust the distance between the terminal of the semiconductor wafer and the terminal of the probe card in non-contact coupling.

SUMMARY

Therefore, it is an object of an aspect of the innovations herein to provide a probe apparatus and a test apparatus, which are capable of overcoming the above drawbacks accompanying the related art. The above and other objects can be achieved by combinations described in the claims. A first aspect of the innovations may include a probe apparatus exchanging signals with a target device, including: a contact section electrically connected to the target device by contacting a terminal of the target device; a non-contact section that exchanges signals with the target device in a state not contacting the terminal of the target device; and a retaining section that retains the contact section and the non-contact section, in such a manner that a relative position between the contact section and the non-contact section in a connection direction connecting the non-contact section and a region corresponding to the target device is displaceable.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
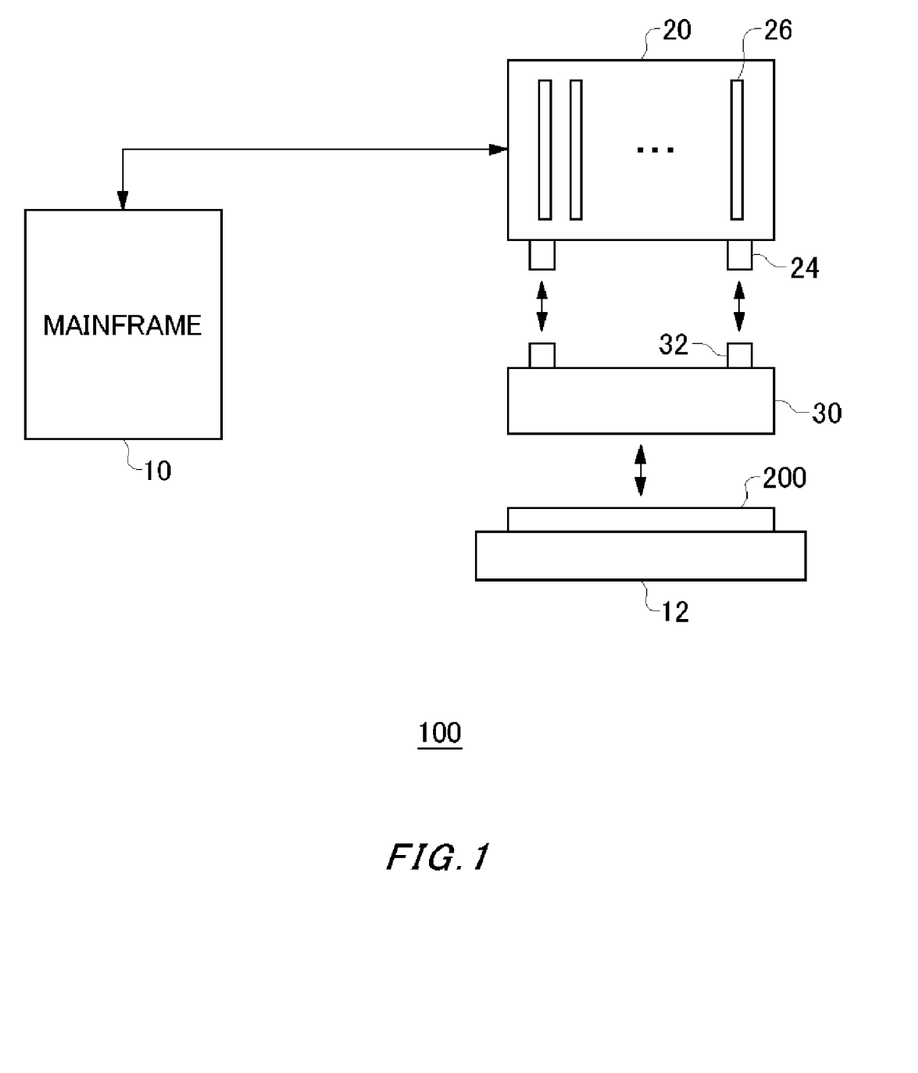
FIG. 1 shows an exemplary configuration of a test apparatus 100 according to an embodiment.

FIG. 1 shows an exemplary configuration of a test apparatus 100 according to an embodiment. The test apparatus 100 of the present example tests a target device 200 such as a semiconductor chip. The target device 200 includes contact and non-contact terminals. The test apparatus 100 may test the target device 200 by conducting a test to each wafer on which a plurality of target devices 200 are formed.

The test apparatus 100 of the present example includes a mainframe 10, a test head 20, a probe apparatus 30, and a wafer tray 12. A wafer on which a plurality of target devices 200 are formed is mounted to the wafer tray 12. When testing a single target device 200, the test apparatus 100 may include, instead of the wafer tray 12, a device mount for mounting a target device 200.

The probe apparatus 30 exchanges signals with a target device 200. The probe apparatus 30 may transmit signals to a plurality of target devices 200 formed on a wafer in parallel. The probe apparatus 30 exchanges signals and power with a target device 200 using both of a non-contact system such as magnetic field coupling or electric field coupling and a contact system such as BGA. In addition, the probe apparatus 30 may include a connector 32 electrically connected with the test head 20.

The test head 20 in the present example includes a plurality of test modules 26 and a connector 24. The connector 24 is electrically connected to the connector 32 of the probe apparatus 30. The plurality of test modules 26 may include a module for generating a signal or power to be supplied to a target device 200, a module for measuring a response signal received by the probe apparatus 30 from the target device 200, etc. The test module 26 is stored in a housing of the test head 20, and is electrically connected to the connector 24.

The mainframe 10 controls a plurality of test modules 26 of the test head 20. For example, the mainframe 10 supplies, to each test module 26, a pattern, edge timing information, or the like of a signal to be generated. In addition, the mainframe 10 or the test module 26 may function as a determining section that determines acceptability of a target device 200 based on a response signal of the target device 200 measured by the test module 26.

The determining section may determine the acceptability of a target device 200 based on a predetermined characteristic of a response signal of the target device 200. For example, the determining section determines the acceptability of the target device 200, by comparing the logic pattern of the response signal with a predetermined expected value pattern. The determining section may also determine the acceptability of the target device 200 based on the power consumption of the target device 200 or the like.

In a different embodiment, the probe apparatus 30 may include at least a part of the functions of the mainframe 10 and the test head 20. For example, the probe apparatus 30 is provided with a test chip executing at least part of the functions of the test module 26. When forming a test chip in the probe apparatus 30, the test apparatus 100 does not have to include a mainframe 10 or a test head 20. In this case the test apparatus 100 may include, in a probe apparatus 30, a power supply that supplies a source power to the probe apparatus 30 and the target device 200.

Figure 2:
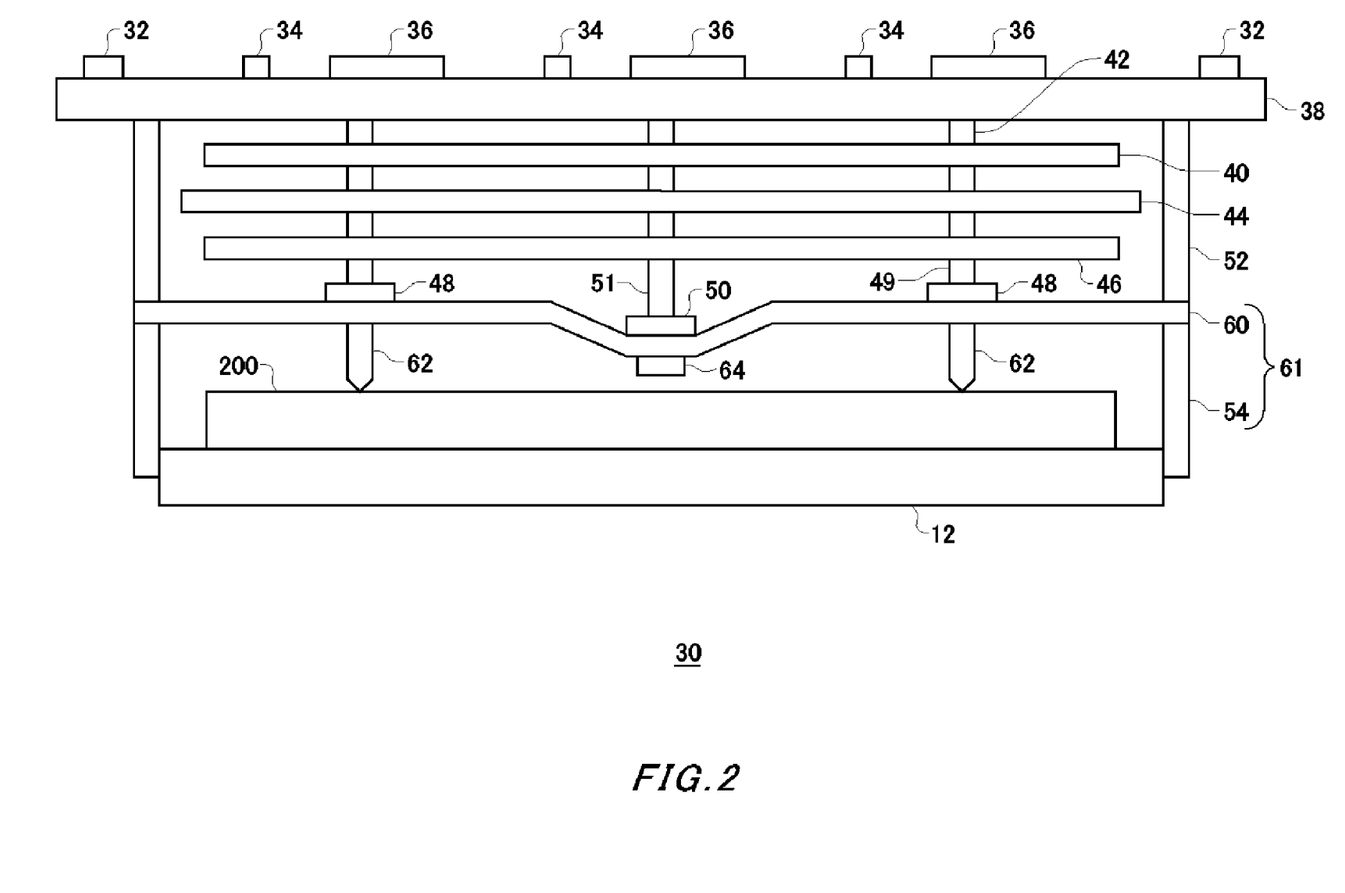
FIG. 2 shows a configuration of a probe apparatus 30, together with a target device 200 and a wafer tray 12.

FIG. 2 shows a configuration of a probe apparatus 30, together with a target device 200 and a wafer tray 12. The probe apparatus 30 includes a connector 32, a bypass capacitor 34, a test chip 36, a test substrate 38, a first conductive rubber 40, an interposer substrate 44, a second conductive rubber 46, a contact section electrode 48, a connection section 49, a non-contact section electrode 50, a stress applying section 51, a partition wall 52, a retaining section 61, a contact terminal 62, and a non-contact section 64.

The contact terminal 62 contacts a terminal of a target device 200, to be electrically connected to the target device 200. The contact terminal 62 is an example of the contact section. The contact terminal 62 may be a conductive bump, for example. The non-contact section 64 exchanges signals with the target device 200, in a state not contacted to the terminal of the target device 200. The non-contact section 64 may exchange signals with the target device 200, by means of magnetic field coupling or electric field coupling.

In the case of magnetic field coupling, for example, the non-contact section 64 includes a coil in a position facing the coil provided in the target device 200. In the case of electric field coupling, the non-contact section 64 includes a plate electrode in a position facing the plate electrode provided in the target device 200. That is, the plate electrode of the non-contact section 64 and the plate electrode of the target device 200 may form a capacitor.

For example, the contact terminal 62 exchanges, with the target device 200, a signal of comparatively low frequency or direct current, or a source power. In addition, the contact terminal 62 may be supplied with a predetermined ground potential. The non-contact section 64 exchanges, with the target device 200, a signal of higher frequency than that of the contact terminal 62. A plurality of contact terminals 62 and a plurality of non-contact sections 64 may be provided, to correspond to the number of target devices 200 and the number of pins of each target device 200.

The retaining section 61 retains the non-contact section 64 and the contact terminal 62 in position facing the target device 200. Note that the retaining section 61 retains the contact terminal 62 and the non-contact section 64, in such a manner that the relative position of the contact terminal 62 and the non-contact section 64, in the connection direction connecting the non-contact section 64 and the region corresponding to the target device 200, is displaceable. Here, the region corresponding to the target device 200 is the region in which the above-explained plate electrode or coil is formed.

The retaining section 61 may displace the non-contact section 64 to be closer to the region of the target device 200, or displace the contact terminal 62 to be farther from the target device 200. The retaining section 61 may displace both of the non-contact section 64 and the contact terminal 62. The configuration enables to adjust the distance between the non-contact section 64 and the target device 200.

The retaining section 61 in the present example includes a thin film section 60 and a fixing section 54. The thin film section 60 may be a membrane having elasticity that is in a plane form when no stress is applied. The thin film section 60 may be formed by a material such as polyimide. The thin film section 60 may have substantially the same form as the form of the facing surface of the target device 200. When the target device 200 is formed on a wafer, the thin film section 60 may have substantially the same form as the form of the surface of the wafer on which the target device 200 is formed (or the region of the surface on which the target device 200 is formed). For example, the front surface and the rear surface of the thin film section 60 are round.

The fixing section 54 fixes a periphery of the thin film section 60 to position the thin film section 60 to a position facing the target device 200 (or the wafer). For example, the fixing section 54 has a cylindrical shape having an inner diameter corresponding to the diameter of the thin film section 60, to fix the entire periphery of the thin film section 60. During this process, the fixing section 54 desirably fixes the thin film section 60 with tension applied in a surface direction. That is, the fixing section 54 fixes the periphery of the thin film section 60 so that the thin film section 60 without any stress being applied can maintain the plane condition. Note that the end of the fixing section 54 to which the thin film section 60 is not fixed is fixed to the wafer tray 12, to position the thin film section 60 at a position facing the target device 200.

The contact terminal 62 is provided on a surface of the thin film section 60 closer to the target device 200. The non-contact section 64 is provided on any surface of the thin film section 60. The non-contact section 64 in the present example is provided on a surface of the thin film section 60 closer to the target device 200. Because the thin film section 60 has elasticity, a part of the region is displaced in the connection direction according to the applied stress.

For example, as shown in FIG. 2, stress is applied to the region of the thin film section 60 to which the non-contact section 64 is provided, in the direction of the target device 200, to shorten the distance between the non-contact section 64 and the target device 200. According to the construction, the relative position between the contact terminal 62 and the non-contact section 64 can be adjusted according to the applied stress, to shorten the distance between the non-contact section 64 and the target device 200.

On the surface of the thin film section 60 facing away from the target device 200, the contact section electrode 48 and the non-contact section electrode 50 are provided. The thin film section 60 may be provided with a penetrating wire electrically connecting the contact section electrode 48 and the contact terminal 62, and a penetrating wire electrically connecting the non-contact section electrode 50 and the non-contact section 64.

The contact section electrode 48 and the non-contact section electrode 50 are electrically connected to the test substrate 38. The contact section electrode 48 and the non-contact section electrode 50 may also be electrically connected to the test module 26 via the connector 32 of the test substrate 38.

The connector 32 is electrically connected to the connector 24 of the test head 20. The test substrate 38 is electrically connected to the test module 26 via the connector 32. The test substrate 38 may exchange signals and power with the test module 26. The test substrate 38 is a print substrate, for example.

The bypass capacitor 34 and the test chip 36 are provided on the test substrate 38. The bypass capacitor 34 and the test chip 36 may be provided on the same surface as the connector 32 on the test substrate 38. When a test is conducted in the unit of a wafer, the bypass capacitor 34 and the test chip 36 may be provided for each target device 200 on the wafer.

The bypass capacitor 34 may be provided between the power supply wire transmitting the source power received from the test module 26 and the ground potential. The bypass capacitor 34 is charged/discharged following the fluctuation in power consumption of the target device 200 supplied with the source power. Accordingly, even when the test module 26 cannot rapidly follow the fluctuation of the power consumption of the target device 200, the bypass capacitor 34 provided in the comparative proximity of the target device 200 can be used to supply power by rapidly following the fluctuation of the power consumption of the target device 200.

The test chip 36 may generate a test signal to be supplied to the target device 200, and may also measure a response signal of the target device 200. The test chip 36 may operate according to a signal generated by the test module 26, and may also operate independently from the test module 26. When the test chip 36 can test the target device 200 independently from the test module 26, the test apparatus 100 does not have to include the mainframe 10 or the test head 20 as described above.

The test substrate 38 may include a penetrating wire penetrating from a surface on which the bypass capacitor 34 and the test chip 36 are provided, to the rear surface thereof. The penetrating wire electrically connects the bypass capacitor 34 and the test chip 36 to the first conductive rubber 40.

The first conductive rubber 40 is provided between the test substrate 38 and the interposer substrate 44, and electrically connects each electrode of the test substrate 38 and the interposer substrate 44. The first conductive rubber 40 may an anisotropic conductive rubber that enables, when applied with stress in a predetermined direction, conduction of the region applied with the stress in the predetermined direction. The stress may be applied to the first conductive rubber 40 by the conductive bump 42 provided in association with each electrode of the test substrate 38 and the interposer substrate 44. The bump(s) 42 may be provided on the test substrate 38 and the interposer substrate 44, and also on the first conductive rubber 40.

The interposer substrate 44 is provided between the first conductive rubber 40 and the second conductive rubber 46. The interposer substrate 44 may have, on a surface thereof closer to the test substrate 38, an electrode provided in position corresponding to each electrode of the test substrate 38. The interposer substrate 44 may have, on a surface thereof closer to the thin film section 60, an electrode provided in position corresponding to each electrode of the thin film section 60.

Moreover, the interposer substrate 44 has a penetrating wire penetrating from the surface thereof closer to the test substrate 38 to the surface thereof closer to the thin film section 60. The penetrating wire electrically connects the electrodes provided on the both surfaces. By doing so, the interposer substrate 44 can be used to electrically connect these electrodes, even when the positioning of the electrodes on the test substrate 38 is different from the positioning of the electrodes on the thin film section 60.

The interposer substrate 44 may desirably have a thermal expansion coefficient between that of the test substrate 38 and that of the thin film section 60. For example, the interposer substrate 44 has a thermal expansion coefficient that is smaller than that of the test substrate 38 and larger than that of the thin film section 60. The interposer substrate 44 may be a ceramic substrate.

The second conductive rubber 46 is provided between the interposer substrate 44 and the thin film section 60. The second conductive rubber 46 may also be an anisotropic conductive rubber just as the first conductive rubber 40. The stress may be applied to the second conductive rubber 46 by the conductive bump provided in association with each electrode of the test substrate 38 and the interposer substrate 44.

The connection section 49 electrically connects the contact section electrode 48 and the second conductive rubber 46. The connection section 49 may be a conductive bump provided for the second conductive rubber 46. Accordingly, the connection section 49 electrically connects the contact terminal 62 and the test substrate 38.

The stress applying section 51 applies stress on the region of the thin film section 60 provided with the non-contact section 64, in the direction of the target device 200. The stress applying section 51 may press the region of the thin film section 60 provided with the non-contact section 64, from the test substrate 38 direction. The stress applying section 51 of the present example may press the non-contact section electrode 50 in the direction of the target device 200. The stress applying section 51 is a conductive bump provided for the second conductive rubber 46, and may electrically connect the non-contact section electrode 50 and the second conductive rubber 46.

The stress applying section 51 of the present example is formed to elongate up to a position closer to the target device 200 than the connection section 49. The length of the stress applying section 51 in the connection direction may be longer than that of the connection section 49. One end of the stress applying section 51 is connected to the second conductive rubber 46, and the other end thereof contacts the region of the thin film section 60 provided with the non-contact section 64.

The partition wall 52 may be a cylindrical partition wall connected to the rear surface of the test substrate 38. The partition wall 52 may store, inside the cylinder, the first conductive rubber 40, the interposer substrate 44, and the second conductive rubber 46. It is desirable that the lower end of the stress applying section 51 closer to the target device 200 be formed to elongate up to a position closer to the target device 200 than the lower end of the partition wall 52 closer to the target device 200.

In addition, in the connection direction, the position of the lower end of the connection section 49 closer to the target device 200 may be substantially the same as the position of the lower end of the partition wall 52 closer to the target device 200. Then, by causing the thin film section 60 to press-contact the lower end of the partition wall 52, the connection section 49 and the contact section electrode 48 are electrically connected, and the thin film section 60 is applied with stress from the stress applying section 51, to displace the relative position between the non-contact section 64 and the contact terminal 62.

In the present example, the lower end of the stress applying section 51 can bring the non-contact section 64 to be closer to the target device 200, according to the length by which the lower end of the stress applying section 51 exceeds the lower end of the partition wall 52. The probe apparatus 30 may further include an adjusting section that adjusts the length by which the lower end of the stress applying section 51 exceeds the lower end of the partition wall 52. The adjusting section may press the stress applying section 51 from the test substrate 38 direction. In another example, the length of the stress applying section 51 may be variable. The stress applying section 51 may includes a protrusion in a bar form and a cylindrical portion accommodating therein the protrusion, and the length of the protrusion protruding from the cylindrical portion may be adjustable. The protrusion and the cylindrical portion may have a screw mechanism to engage to each other.

The structure of applying stress to the thin film section 60 is not limited to the above-described structure. For example, the region of the contact terminal 62 may be pressed from the target device 200 direction. In addition, the region of the contact terminal 62 may be pulled from the test substrate 38 direction, or the region of the non-contact section 64 may be pulled from the target device 200 direction. It is also possible to press the region of the non-contact region 64 from the test substrate 38 direction, using a different structure from that shown in FIG. 2.

A method of applying stress to the thin film section 60 is not limited to a method of causing a member to contact the thin film section 60. For example, stress may be applied to the thin film section 60 using magnetic force or the like. Note that the first conductive rubber 40, the interposer substrate 44, and the second conductive rubber 46 may be hermetically sealed by the test substrate 38, the partition wall 52, and the thin film section 60, by causing the lower end of the partition wall 52 to press-contact the thin film section 60.

The described configuration enables to adjust the distance between the non-contact section 64 and the target device 200. In addition, usage of the thin film section 60 having elasticity and the conductive rubber can improve the connection reliability of the contact terminal 62 and the target device 200, even when the surface of the wafer on which the target device 200 is formed is not an even plane.

Figure 3A:
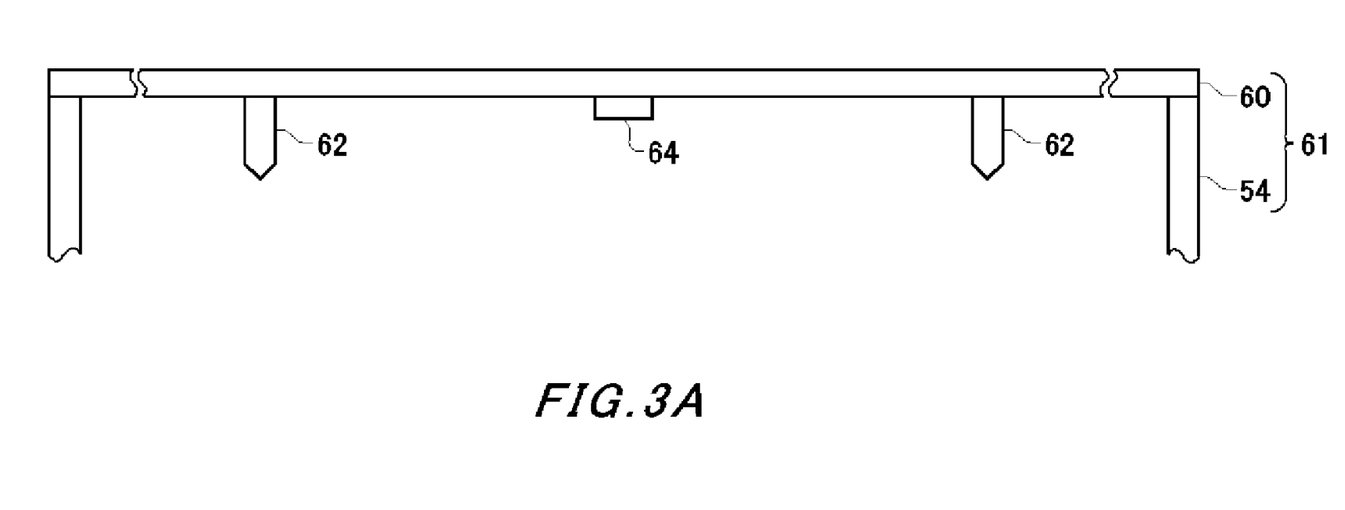
FIG. 3A shows an example of a retaining section 61, a contact terminal 62, and a non-contact section 64, when no stress is applied.

FIG. 3A shows an example of a retaining section 61, a contact terminal 62, and a non-contact section 64, when no stress is applied. As described above, when no stress is applied, the thin film section 60 maintains its plane form.

Figure 3B:
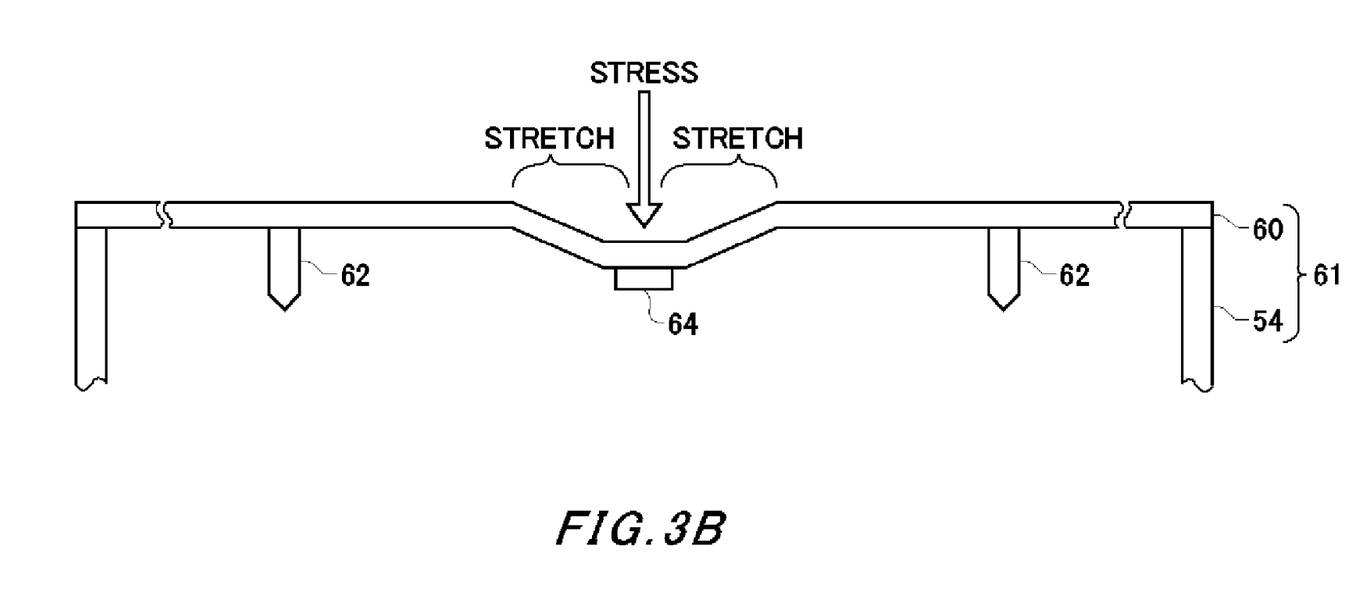
FIG. 3B shows an example of a retaining section 61, a contact terminal 62, and a non-contact section 64, when stress is applied.

FIG. 3B shows an example of a retaining section 61, a contact terminal 62, and a non-contact section 64, when stress is applied. In the present example, stress is applied to the region provided with the non-contact section 64, toward the target device 200.

In this example, the region of the thin film section 60 that is provided with the non-contact section 64 stretches toward the target device 200. In the present example, the mentioned region of the thin film section 60 stretches to be closer to the target device than the region fixed by the fixing section 54. After the stress has stopped, the thin film section 60 will return to the plane form as shown in FIG. 3A.

Figure 4:
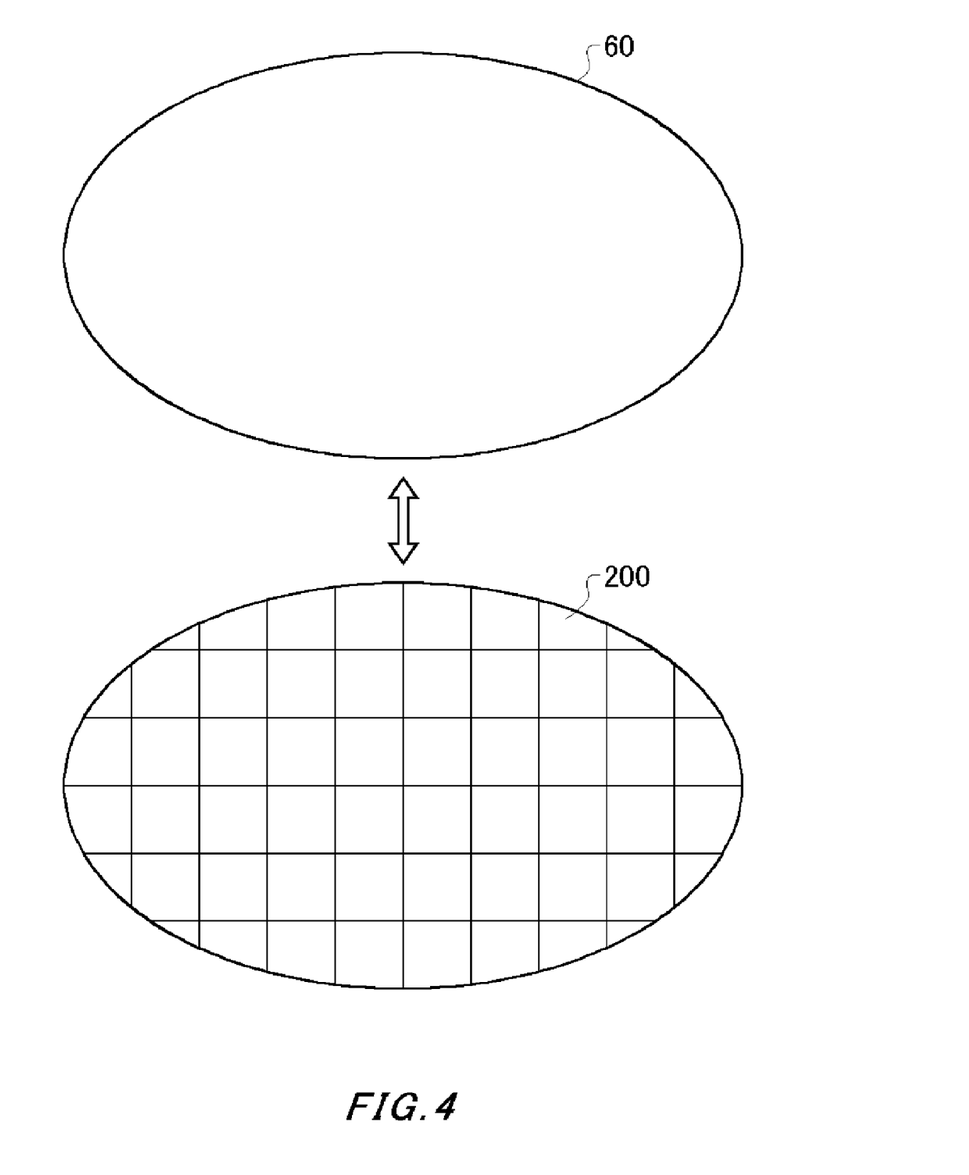
FIG. 4 shows an example of a thin film section 60.

FIG. 4 is a perspective view of an example of the thin film section 60. The probe apparatus 30 of the present example is connected to the wafer on which a plurality of target devices 200 are formed. The thin film section 60 may have a round form that is substantially the same as the form of the surface of the wafer on which the target devices 200 are formed.

Figure 5:
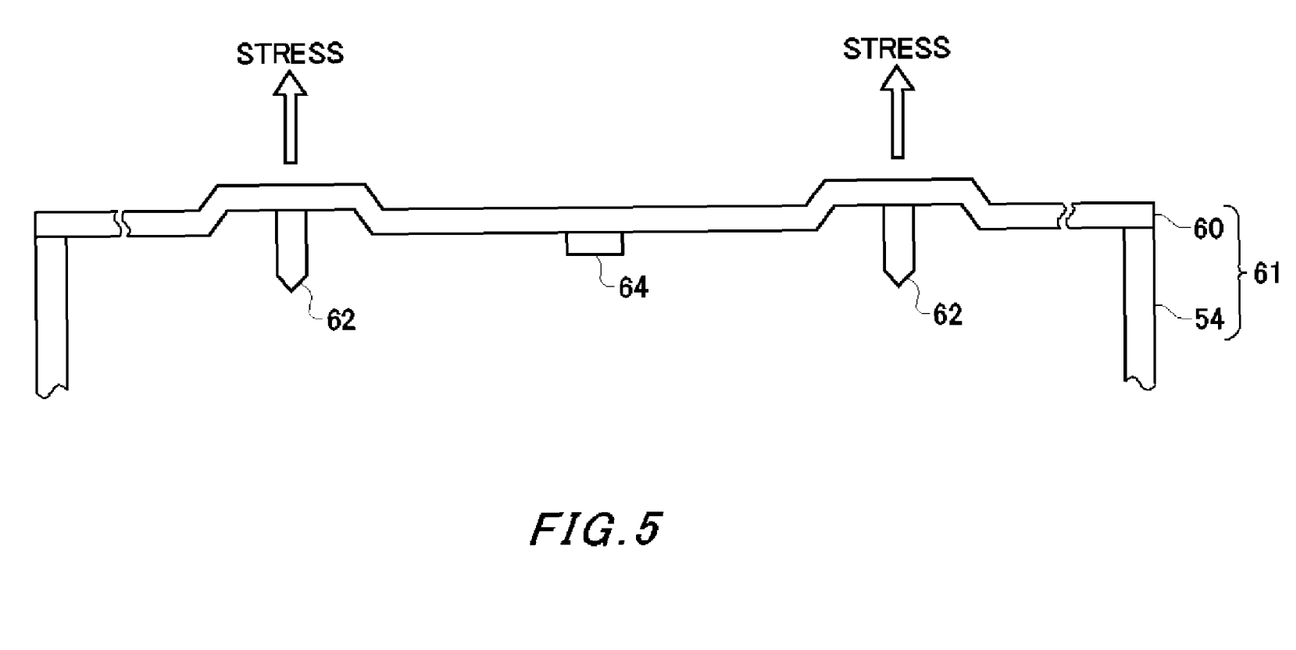
FIG. 5 shows another example of a retaining section 61, a contact terminal 62, and a non-contact section 64, when stress is applied.

FIG. 5 shows another example of a retaining section 61, a contact terminal 62, and a non-contact section 64, when stress is applied. In the present example, stress is applied to the region provided with the contact terminal 62, toward the test substrate 38.

In this example, the region of the thin film section 60 that is provided with the contact terminal 62 stretches toward the test substrate 38. In the present example, the mentioned region of the thin film section 60 stretches to be closer to the test substrate 38 than the region fixed by the fixing section 54.

For example, by pressing the contact terminal 62 by means of the target device 200 etc., the region of the thin film section 60 is applied with stress. After the stress has stopped, the thin film section 60 will return to the plane form as shown in FIG. 3A. This configuration also allows the distance between the non-contact section 64 and the target device 200 to be adjusted. Note that the length of the contact terminal 62 can be adjustable.

Figure 6:
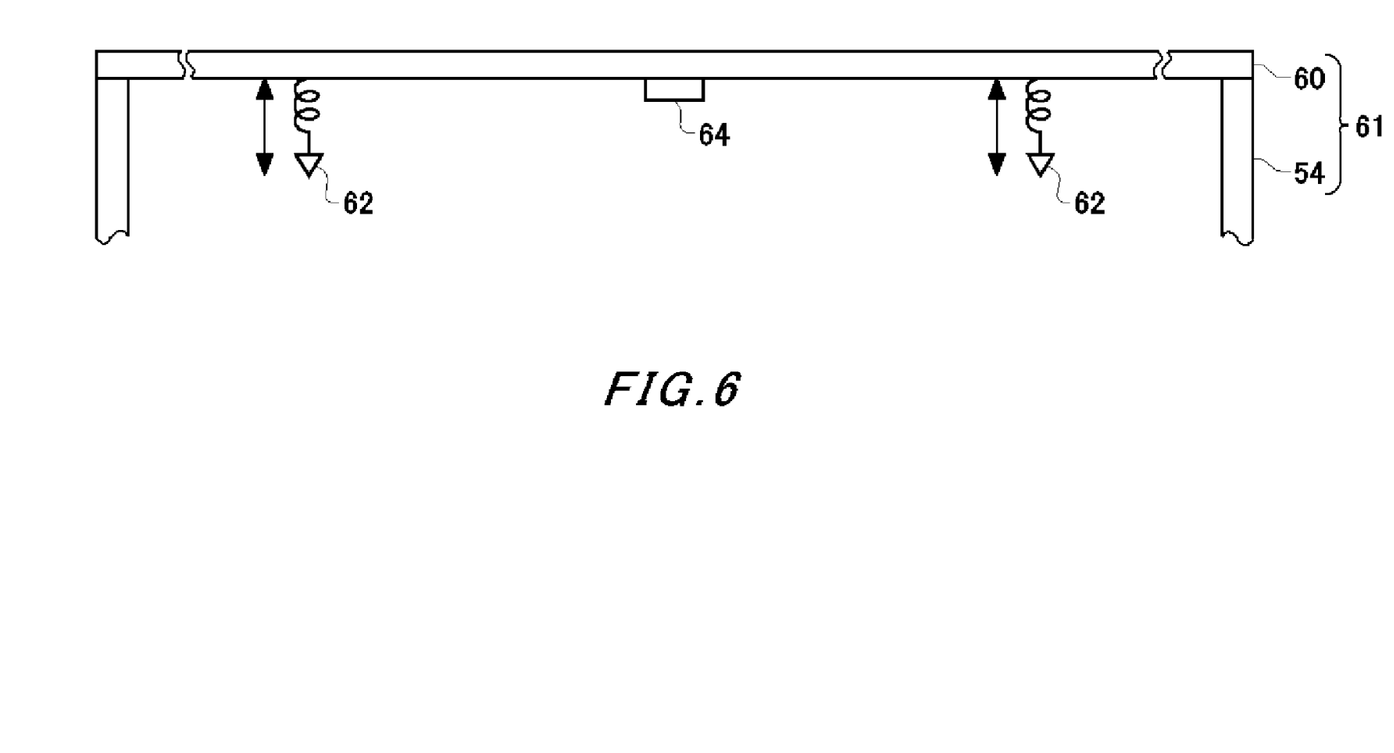
FIG. 6 shows another example of a retaining section 61, a contact terminal 62, and a non-contact section 64.

FIG. 6 shows another example of a retaining section 61, a contact terminal 62, and a non-contact section 64. In the present example, the thin film section 60 does not have to be elastic. The thin film section 60 may be a print substrate or a silicon substrate.

In the present example, the contact terminal 62 may have its length variable according to the applied stress, such as a spring pin. This configuration also allows to displace the relative position between the lower ends of the contact terminal 62 and the non-contact section 64 in the connection direction, to be able to adjust the distance between the non-contact section 64 and the target device 200.

Figure 7A:
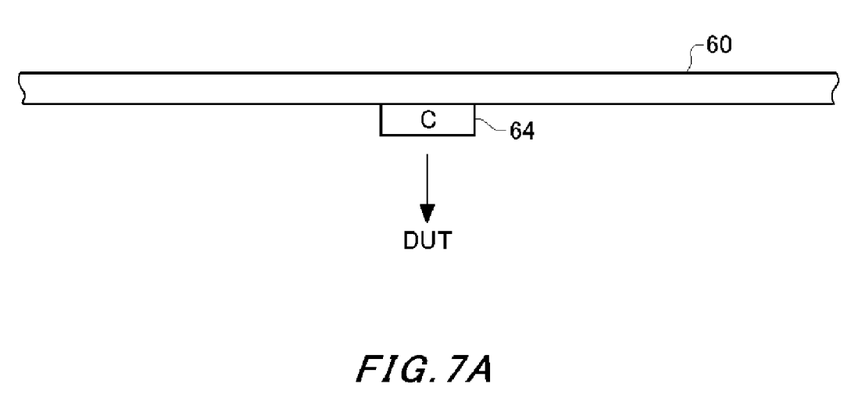
FIG. 7A shows an example of a non-contact section 64.

FIG. 7A shows an example of a non-contact section 64. The non-contact section 64 of the present example functions as an electric field coupling section C (64) that is electric-field-coupled with the target device 200. The electric field coupling section C (64) is provided on a surface of the thin film section 60 closer to the target device 200, in a position facing the electric field coupling section of the target device 200. The electric field coupling section C (64) may have a plate electrode. The electric field coupling section C (64) is manufactured more easily than a coil or the like, which accordingly allows manufacturing of the probe apparatus 30 with ease.

Figure 7B:
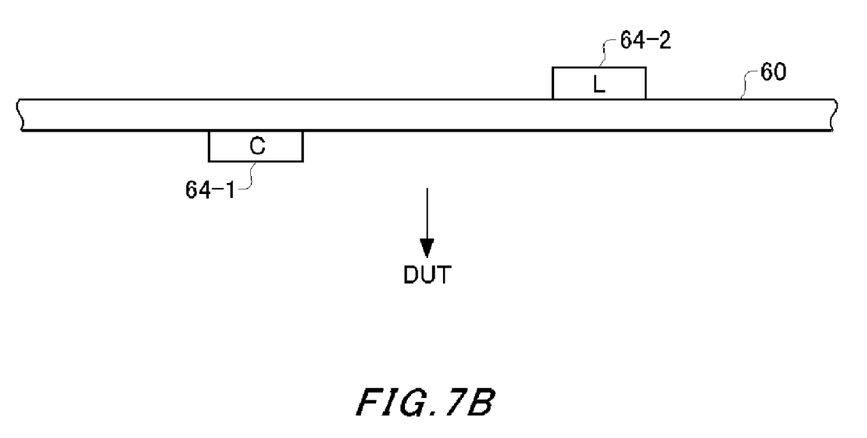
FIG. 7B shows another example of a non-contact section 64.

FIG. 7B shows another example of a non-contact section 64. The probe apparatus 30 of the present example includes, as a non-contact section 64, an electric field coupling section C (64-1) and a magnetic field coupling section L (64-2). The magnetic field coupling section L (64-2) is magnetic-field-coupled with the magnetic field coupling section of the target device 200. The magnetic field coupling section L (64-2) may have a coil.

The probe apparatus 30 may include the electric field coupling section C (64-1) and the magnetic field coupling section L (64-2) on respectively different surfaces of the thin film section 60. In addition, the probe apparatus 30 may include one of the electric field coupling section C (64-1) and the magnetic field coupling section L (64-2) on respectively different surfaces of the thin film section 60. This configuration enables to form as many non-contact sections 64 as possible on the thin film section 60. In particular, the electric field coupling section C (64-1) has a comparatively large area, and so as many non-contact sections 64 as possible can be formed by providing them on both of the surfaces of the thin film section 60.

The probe apparatus 30 may include an electric field coupling section C (64-1) on a surface of the thin film section 60 that is closer to the target device 200, and includes a magnetic field coupling section L (64-2) on a surface of the thin film section 60 that is farther from the target device 200. Generally speaking, the magnetic field coupling is more suitable for long-distance signal transmission than the electric field coupling, and therefore the mentioned construction allows provision of as many non-contact sections 64 as possible while maintaining the communication reliability.

Alternatively, the probe apparatus 30 may include a magnetic field coupling section L (64-2) on a surface of the thin film section 60 that is closer to the target device 200, and includes an electric field coupling section C (64-1) on a surface of the thin film section 60 that is farther from the target device 200. Generally speaking, the magnetic field coupling causes more crosstalk in the horizontal direction than the electric field coupling. Therefore, the mentioned construction can reduce crosstalk in the magnetic field coupling section L (64-2) while allowing provision of as many non-contact sections 64 as possible. On which surface of the thin film section 60 which of the coupling sections is to be formed may be determined depending on the interval between the coupling sections, the thickness of the thin film section 60, etc.

Figure 8:
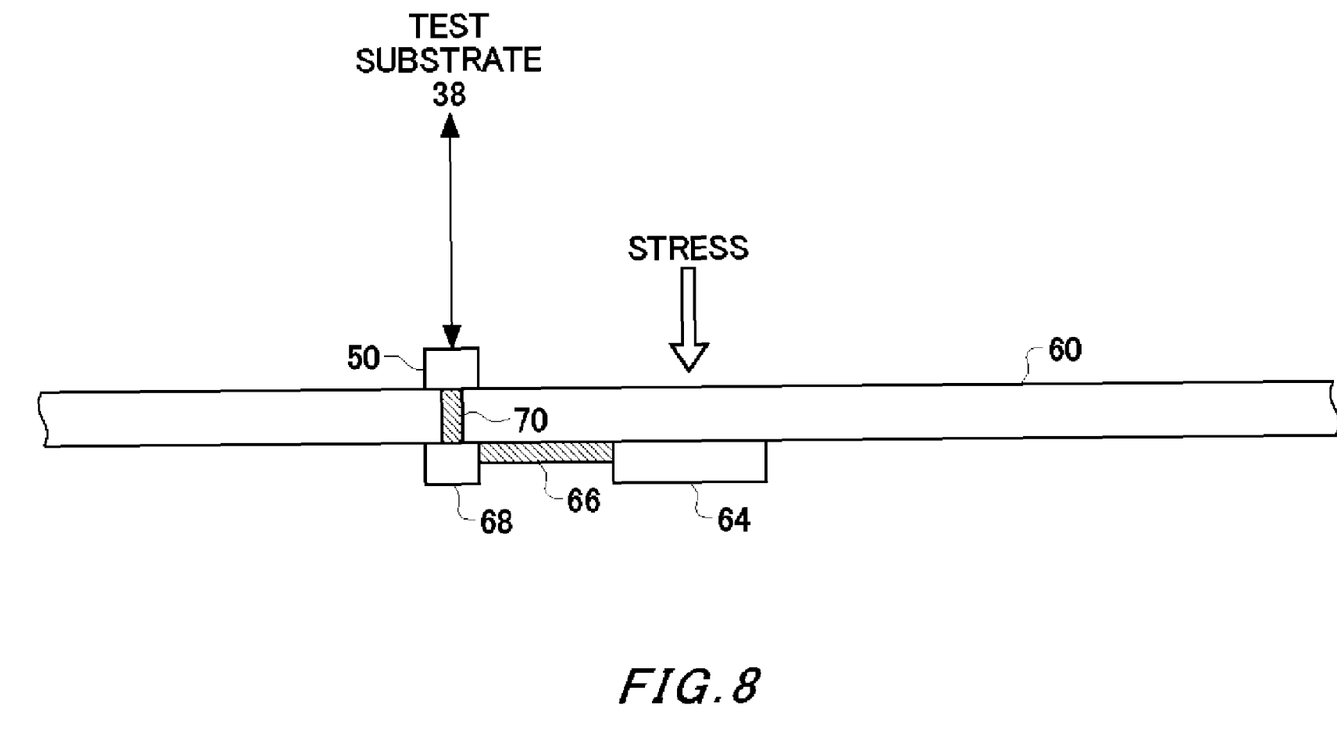
FIG. 8 shows an exemplary connection between a non-contact section 64 and a non-contact section electrode 50 in a thin film section 60.

FIG. 8 shows an exemplary connection between a non-contact section 64 and a non-contact section electrode 50 in a thin film section 60. The non-contact section 64 of the present example is provided on a surface of the thin film section 60 that is closer to the target device 200.

The thin film section 60 further includes a wire 66, a relay electrode 68, and a penetrating wire 70, in addition to the non-contact section electrode 50. The wire 66 is provided on a surface of the thin film section 60 that is closer to the target device 200, and electrically connects the non-contact section 64 to the relay electrode 68.

The relay electrode 68 is provided on a surface of the thin film section 60 that is closer to the target device 200. In addition, the non-contact section electrode 50 is provided on a surface of the thin film section 60 closer to the test substrate 38, in a position facing the relay electrode 68.

For the thin film section 60, the penetrating wire 70 is provided to penetrate from a surface closer to the target device 200 to a surface closer to the test substrate 38, to electrically connect the relay electrode 68 to the non-contact section electrode 50. The configuration allows electrical connection between the non-contact section electrode 50 and the non-contact section 64.

In the configuration of the present example, the stress applying section 51 of the probe apparatus 30 applies stress to the region not provided with the non-contact section electrode 50. Therefore, the stress applying section 51 does not have to have conductive characteristics. Note that the non-contact section electrode 50 is electrically connected to the test substrate 38 via the second conductive rubber 46 or the like.

In the configuration, a member electrically connected to the non-contact section electrode 50 can be provided independently from the stress applying section 51, which allows the stress applying section 51 to be designed with ease. In addition, the fact that no stress is applied to the non-contact section electrode 50 helps protect the non-contact section electrode 50.

The stress applying section 51 may be a non-conductive member formed in a bar form, which extends from the test substrate 38 or from the interposer substrate 44. In this case, the stress applying section 51 may be formed to penetrate the conductive rubber. The stress applying section 51 may be a non-conductive bump formed on the second conductive rubber 46.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A probe apparatus exchanging signals with a target device, comprising:
    a contact section electrically connected to the target device by contacting a terminal of the target device;
    a non-contact section that exchanges signals, via a signal path not including the contact section, with the target device in a state not contacting the terminal of the target device; and
    a retaining section, including a thin film section, that retains the contact section and the non-contact section, in such a manner that a relative position between the contact section and the non-contact section in a connection direction connecting the non-contact section and a region corresponding to the target device is displaceable, wherein the contact section and at least a part of the non-contact section are provided on a surface of the thin film section closer to the target device.

2. The probe apparatus according to claim 1, wherein
    at least a partial region of the thin film section stretches in the connection direction according to applied stress and returns to a form prior to application of the stress, after the stress has stopped.

3. The probe apparatus according to claim 1, wherein
    the probe apparatus transmits signals to a plurality of the target devices formed on a wafer in parallel, and
    the thin film section has a shape substantially the same as a shape of a surface of the wafer on which the target devices are formed.

4. The probe apparatus according to claim 1, wherein
    the retaining section further includes a fixing section that fixes a periphery of the thin film section to position the thin film section to a position facing the target device.

5. The probe apparatus according to claim 4, wherein
    the fixing section fixes the thin film section with tension applied in a surface direction.

6. The probe apparatus according to claim 1, further comprising:
    a test substrate that generates a signal to be inputted to the target device and exchanges signals with the target device via the thin film section; and
    a conductive rubber provided between the thin film section and the test substrate.

7. The probe apparatus according to claim 1, further comprising:
a stress applying section that applies stress to a region of the thin film section that is provided with the non-contact section, in the connection direction.

8. The probe apparatus according to claim 7, further comprising:
a test substrate that generates a signal to be inputted to the target device and exchanges signals with the target device via the thin film section; and
a connection section that electrically connects the contact section and the test substrate, wherein
the stress applying section elongates to be closer to the target device than the connection section, thereby contacting the region of the thin film section that is provided with the non-contact section.

9. The probe apparatus according to claim 1, comprising, as the non-contact section, an electric field coupling section that is electric-field-coupled with the target device, on the surface of the thin film section closer to the target device.

10. The probe apparatus according to claim 1, comprising, as the non-contact section, an electric field coupling section that is electric-field-coupled with the target device, and a magnetic field coupling section that is magnetic-field-coupled with the target device, on respectively different surfaces of the thin film section.

11. The probe apparatus according to claim 10, wherein
the non-contact section includes the electric field coupling section on the surface of the thin film section closer to the target device, and includes the magnetic field coupling section on a surface of the thin film section farther from the target device.

12. The probe apparatus according to claim 1, wherein
the non-contact section is provided on the surface of the thin film section closer to the target device, and
the thin film section includes:
a wire provided on a surface thereof closer to the target device, and electrically connected to the non-contact section;
an electrode provided on a surface thereof farther from the target device; and
a penetrating wire provided to penetrate from the surface thereof closer to the target device to the surface thereof farther from the target device, and electrically connecting the wire to the electrode.

13. A test apparatus for testing a target device, comprising:
the probe apparatus according to claim 1 exchanging signals with the target device; and
a determining section that determines acceptability of the target device based on a response signal received by the probe apparatus from the target device.

14. The probe apparatus according to claim 1, wherein
the non-contact section exchanges signals with the target device by means of magnetic field coupling or electric field coupling.

15. A probe apparatus exchanging signals with a target device, comprising:
a contact section electrically connected to the target device by contacting a terminal of the target device;
a non-contact section that exchanges signals, via a signal path not including the contact section, with the target device in a state not contacting the terminal of the target device by means of magnetic field coupling or electric field coupling; and
a retaining section that retains the contact section and the non-contact section, in such a manner that a relative position between the contact section and the non-contact section in a connection direction connecting the non-contact section and a region corresponding to the target device is displaceable.

16. The probe apparatus according to claim 15, wherein the retaining section includes a thin film section on which the contact section and non-contact section are provided.

17. The probe apparatus according to claim 16, wherein
at least a partial region of the thin film section stretches in the connection direction according to applied stress and returns to a form prior to application of the stress, after the stress has stopped.

18. The probe apparatus according to claim 16, comprising, as the non-contact section, an electric field coupling section that is electric-field-coupled with the target device, and a magnetic field coupling section that is magnetic-field-coupled with the target device, on respectively different surfaces of the thin film section.

19. The probe apparatus according to claim 18, wherein
the non-contact section includes the electric field coupling section on a surface of the thin film section closer to the target device, and includes the magnetic field coupling section on a surface of the thin film section farther from the target device.

20. A test apparatus for testing a target device, comprising:
the probe apparatus according to claim 15 exchanging signals with the target device; and
a determining section that determines acceptability of the target device based on a response signal received by the probe apparatus from the target device.

* * * * *